(12) United States Patent
Réblewski (10) Patent No.: US 7,263,456 B2
(45) Date of Patent: Aug. 28, 2007

(54) ON CIRCUIT FINALIZATION OF CONFIGURATION DATA IN A RECONFIGURABLE CIRCUIT

(75) Inventor: Frédéric Réblewski, Paris (FR)

(73) Assignee: M2000, Bievres (FR)

( * ) Notice: Subject to any disclaimer, the term of this patent is extended or adjusted under 35 U.S.C. 154(b) by 39 days.

(21) Appl. No.: 11/330,418

(22) Filed: Jan. 10, 2006

(65) Prior Publication Data

US 2007/0162247 A1    Jul. 12, 2007

(51) Int. Cl.
*G06F 9/00* (2006.01)
(52) U.S. Cl. .................. 702/119; 326/37; 326/38; 326/39; 326/40; 702/123; 713/1; 713/2; 713/100; 716/16; 716/17
(58) Field of Classification Search ............ 326/37, 326/38, 39, 40; 700/1, 86, 90, 108; 702/85, 702/108, 113, 123; 713/1, 2, 100; 716/12, 716/16, 17
See application file for complete search history.

(56) References Cited

U.S. PATENT DOCUMENTS

| | | | | |
|---|---|---|---|---|
| 3,466,641 | A * | 9/1969 | Putman | 137/831 |
| 3,473,160 | A * | 10/1969 | Wahlstrom | 326/41 |
| 3,495,220 | A * | 2/1970 | Stockert et al. | 718/102 |
| 5,426,379 | A | 6/1995 | Trimberger | |
| 6,191,614 | B1 * | 2/2001 | Schultz et al. | 326/41 |
| 6,204,687 | B1 * | 3/2001 | Schultz et al. | 326/40 |
| 6,255,848 | B1 * | 7/2001 | Schultz et al. | 326/41 |
| 6,262,596 | B1 * | 7/2001 | Schultz et al. | 326/41 |
| 6,265,894 | B1 * | 7/2001 | Reblewski et al. | 326/39 |
| 6,388,465 | B1 * | 5/2002 | Barbier et al. | 326/40 |
| 6,429,682 | B1 * | 8/2002 | Schultz et al. | 326/41 |
| 6,594,810 | B1 * | 7/2003 | Reblewski et al. | 716/12 |
| 2003/0055658 | A1 * | 3/2003 | RuDusky | 705/1 |
| 2004/0178820 | A1 * | 9/2004 | Barbier et al. | 326/40 |
| 2007/0057693 | A1 * | 3/2007 | Reblewski | 326/41 |

OTHER PUBLICATIONS

Yu et al., "Defect-tolerant fpga switch block and connection block with fine-grain redundancy for yield enhancement," Filed Programmable Logic and Applications, 2005, International Conference on Tampere, Finland, Aug. 24-26, 2005, Piscataway, NJ, USA IEEE, pp. 255-262, EP010840012.*
US 5,829,961, 4/1999, Trimberger (withdrawn).
Yu et al., "Defect Tolerance for Yield Enhancement of FPG Interconnect Using Fine-grain and Coarse-grain Redundancy," M.A.SC. Thesis, Aug. 2005, pp. 1-75, XP002432579, Department of Electrical and Computer Engineering, University of British Columbia.
Krasteva et al., "Straight Method for Reallocation of Complex Cores by Dynamic Reconfiguration in Virtex II FPGAs," Rapid System Prototyping, 2005 (RSP 2005), The 16th IEEE International Workshop on Montreal, Canada, Jun. 8-10 2005, Piscataway, NJ, USA, IEEE, pp. 77-83, XP010836611.
Sundararajan et al., "Run-Time defect tolerance using JBits," Proceedings of the 2001 ACM/SIGDA Ninth International Symposium on filed programmable gate arrays, 2001, pp. 193-198, XP002432580.

* cited by examiner

*Primary Examiner*—Edward Cosimano
(74) *Attorney, Agent, or Firm*—Schwabe, Williamson & Wyatt, P.C.

(57) ABSTRACT

Reconfigurable circuits with configuration data loaders are described herein. The configuration data loaders are adapted to enable on circuit finalization of configuration data provided in symbolic form, not fully resolved.

17 Claims, 8 Drawing Sheets

ON CIRCUIT FINALIZATION OF CONFIGURATION DATA IN A RECONFIGURABLE CIRCUIT

TECHNICAL FIELD

The present invention relates to the field of reconfigurable circuits. More specifically, the present invention relates to on circuit finalization of configuration data in reconfigurable circuits.

BACKGROUND

Reconfigurable circuits such as those that include Field Programmable Gate Arrays (FPGAs) are circuits that can be programmed to execute some sort of application. Typically, reconfigurable circuits include reconfigurable logic resources, such as reconfigurable function blocks, and reconfigurable interconnect resources, such as reconfigurable connection matrices. Each of the reconfigurable function blocks typically includes reconfigurable logic cells, while each of the reconfigurable connection matrices includes reconfigurable interconnect devices (e.g., crossbar devices).

Actual programming of a reconfigurable circuit so that it can be configured in a particular manner is generally performed using a software tool suite that may be run on a computing device such as a workstation, and storing the resulting finalized configuration data into a nonvolatile storage such as a programmable read-only memory (PROM). In order to program the reconfigurable circuit, the software tool suite typically converts a high-level description of a circuit design implementing an application into finalized configuration data. The finalized configuration data will typically be a collection of bits that can be provided to the reconfigurable circuit and ready to be acted on by the reconfigurable circuit to configure itself, without further processing and/or resolution. The configuration data may be provided upon start-up of the reconfigurable circuit or upon request by the user.

Figure 1:
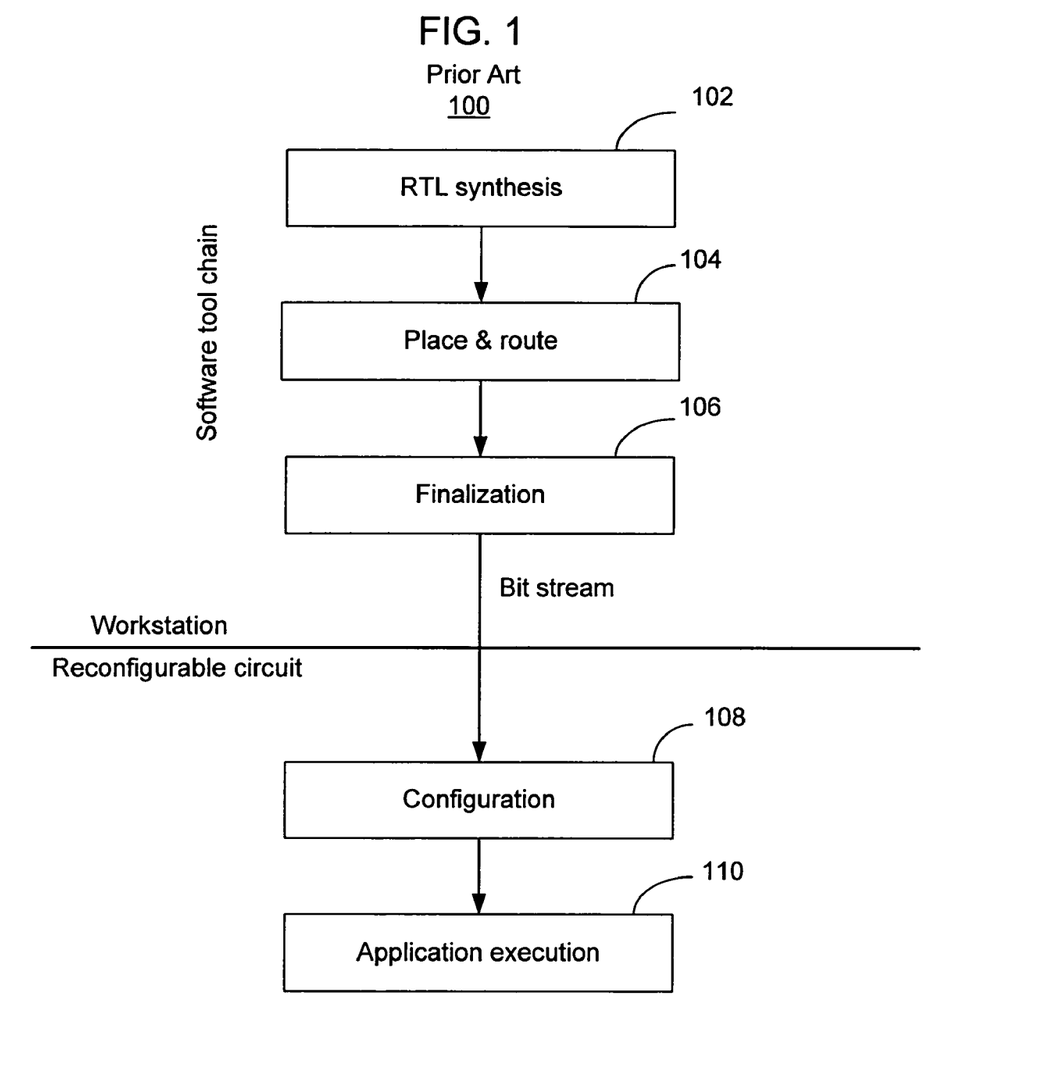
FIG. 1 illustrates a conventional process for configuring a reconfigurable circuit and for executing an application on the resulting configured reconfigurable circuit.

FIG. 1 depicts a conventional process for configuring a conventional reconfigurable circuit and for executing an application on the resulting configured reconfigurable circuit. The process 100 begins when register transfer logic (RTL) synthesis is performed transforming a high level description (RTL description) of a circuit design implementing an application into a low level description at 102. The RTL synthesis, in brief, involves synthesis of the circuit design. The resulting low-level description includes netlists of elementary functions that execute the same global functions as the initial RTL description. Next, the elementary functions are placed and routed (place and route) at 104. In place and route, the logic resources included in the reconfigurable function blocks of the reconfigurable circuit are assigned to implement the elementary functions, and the routing of the signals between the assigned logic resources, using the connection resources (that are included in the reconfigurable connection matrices) is determined.

Following place and route, a finalization operation is performed whereby a collection of bits that can be directly read and acted on by the reconfigurable circuit to configure itself (without further processing and/or resolution) is generated at 106. This operation typically includes generation of the bitmaps of the reconfigurable connection matrices and the configuration data of the reconfigurable function blocks present in the reconfigurable circuit. Once the configuration data is generated, it is typically stored in some nonvolatile storage such as a PROM.

Upon power-up of the reconfigurable circuit or upon user request, the reconfigurable circuit is configured using the bit information stored in the nonvolatile storage, which is typically external to the reconfigurable circuit at 108. Once the reconfigurable circuit has been properly configured, the application may be executed on the configured reconfigurable circuit at 110.

At least two issues arise when a conventional process such as the one depicted in FIG. 1 is used in configuring a reconfigurable circuit. First, since the amount of finalized configuration data in bit form can be substantial, such a process 100 typically calls for a large nonvolatile storage (i.e., PROM) for storing the finalized configuration data. Second, the bit information generated by the workstation is often unable to take into account the precise characteristics of the reconfigurable circuit being configured. For example, the software tool suite may not be able to recognize defective function blocks that may be present in the reconfigurable circuit. Further, the software tool suite may not be able to take into account the varying array sizes of different reconfigurable circuits or accommodate newer arrays not recognized by the software tool suite.

BRIEF DESCRIPTION OF THE DRAWINGS

The present invention will be described by way of exemplary embodiment, but not limitations, illustrated in the accompanying drawings in which like references to note similar elements, and in which.

DETAILED DESCRIPTION OF EMBODIMENTS OF THE INVENTION

In the following description, for purposes of explanation, specific numbers, materials, and configurations are set forth in order to provide a thorough understanding of the present invention. However, it will be apparent to one skilled in the art that the present invention may be practiced without the specific details. In other instances, well-known features are omitted or simplified in order not to obscure the present invention.

Reference in the specification to "various embodiments" or "some embodiments" means that a particular feature, structure, or characteristic described in connection with the embodiments are included in at least one embodiment of the invention. The appearances of the phrase "in various embodiments" in various places in the specification do not necessarily all refer to the same embodiments, although they may.

For the purposes of the present invention, the phrase "A/B" means A or B. For the purposes of the present invention, the phrase "A and/or B" means "(A), (B), or (A and B)." For the purposes of the present invention, the phrase "at least one of A, B and C" means "(A), (B), (C), (A and B), (A and C), (B and C) or (A, B and C)." For the purposes of the present invention, the phrase "(A)B" means "(B) or (AB)," that is, A is an optional element.

According to various embodiments of the invention, reconfigurable circuits are provided that includes an array of reconfigurable resources coupled to a configuration data loader. For the embodiments, the reconfigurable resources may include a plurality of reconfigurable function blocks and reconfigurable connection matrices. Each of the reconfigurable function blocks may include reconfigurable logic while each of the reconfigurable connection matrices may each include inputs and outputs coupled to the reconfigurable function blocks. The reconfigurable connection matrices may each further include connection resources that can be configured to selectively connect inputs to specific outputs of their respective reconfigurable connection matrix.

For the embodiments, the configuration data loader may be adapted to receive a first set of configuration data to be used to configure all or a subset of the reconfigurable logic and the connection resources of the reconfigurable circuit. In some embodiments, the first set of configuration data to be received by the configuration data loader may be in a symbolic form and not fully particularized in specifying the configuration of the reconfigurable circuit. Upon receiving the first set of configuration data, the configuration data loader may generate and output a second set of configuration data based at least in part on the first set of configuration data, with the second set of configuration data being fully particularized in specifying the configuration of the reconfigurable circuit.

According to some embodiments, by incorporating a configuration data loader into a reconfigurable circuit, a smaller binary configuration file may be used for storing configuration data that may not be in a finalized form. Such a configuration data loader may facilitate particularization of configuration data even when defective reconfigurable function blocks are present in the reconfigurable circuit, to support arrays that are larger than needed, and to support arrays that are newer than those known by, for example, the software tool suite running on the workstation at the time it was run.

Figure 2:
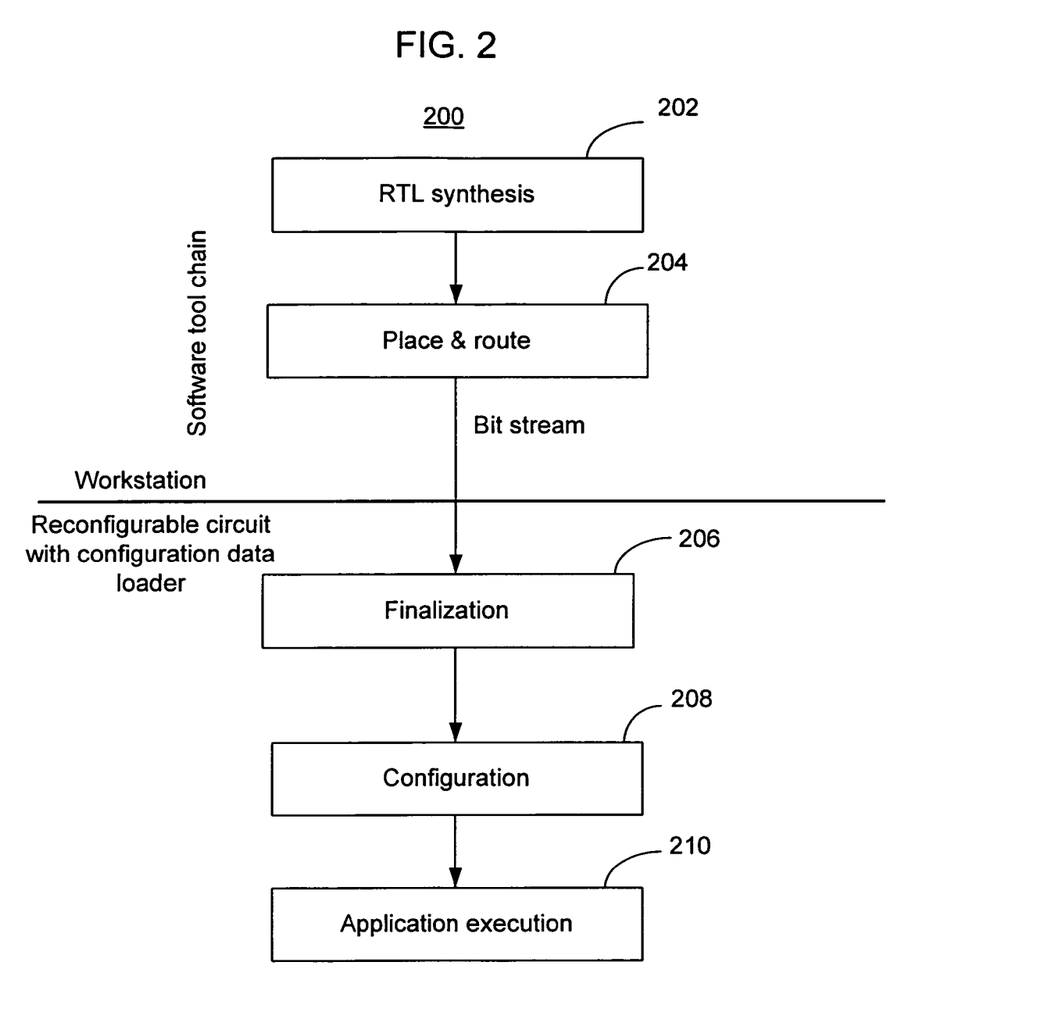
FIG. 2 illustrates a process for configuring a reconfigurable circuit, and for executing an application on the resulting configured reconfigurable circuit in accordance with various embodiments.

FIG. 2 depicts a process for configuring a reconfigurable circuit with a configuration data loader, and for executing an application using the configured reconfigurable circuit in accordance with various embodiments. As illustrated, the process 200 includes an RTL synthesis and place and route operations 202 and 204 that may be performed using a software tool suite running on a workstation similar to the conventional process 100 depicted in FIG. 1. Also similar to the conventional process 100, the configuration and application execution operations 208 and 210 are performed on the reconfigurable circuit. However, unlike the conventional process 100, the finalization operation 206 is performed at the reconfigurable circuit with the configuration data loader. Further, the finalization operation 206 may include particularization of the configuration data such that the configuration data is particularized for the specific characteristics of the reconfigurable circuit. In various embodiments, the finalization operation 206 may be performed at power up of the reconfigurable circuit with the configuration data loader or upon user request.

Figure 3A:
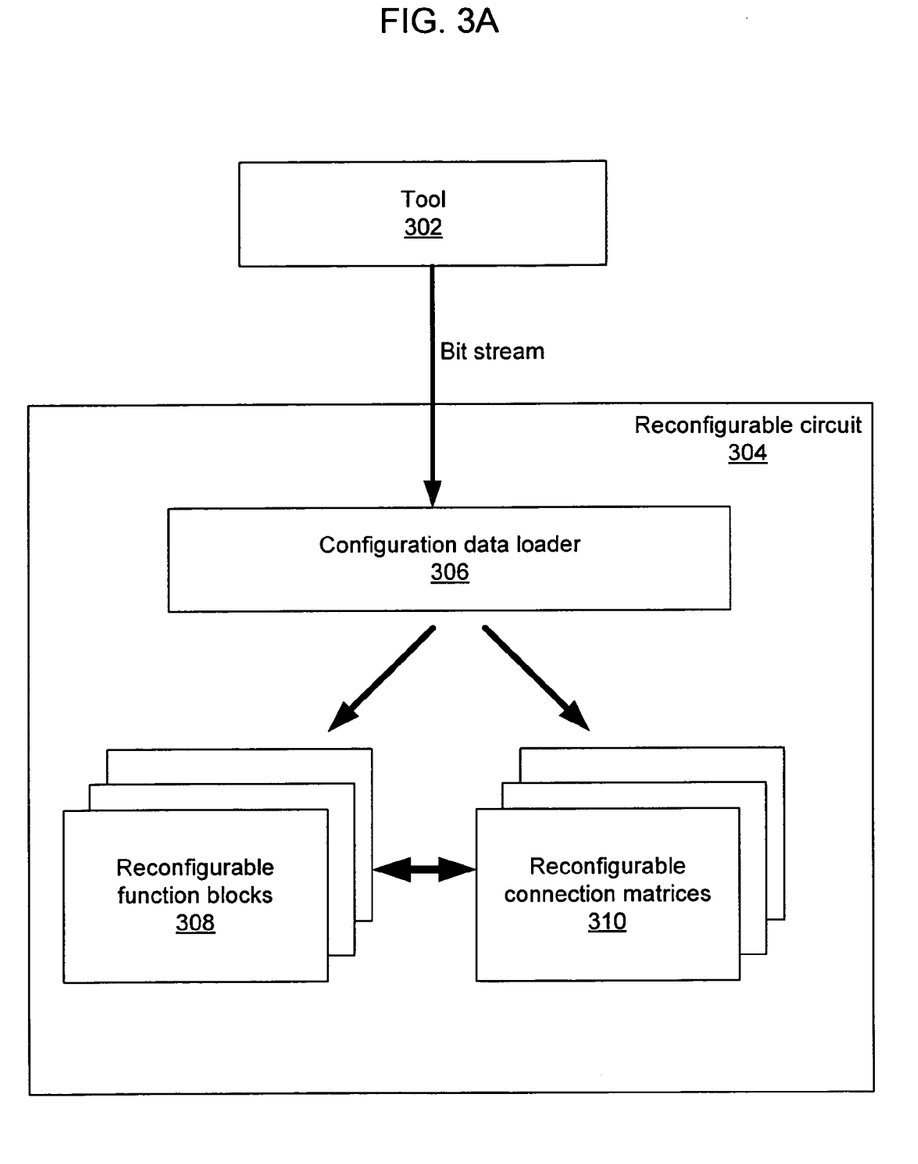
FIG. 3A illustrates a block diagram of a reconfigurable circuit with a configuration data loader receiving a first set of configuration data from a tool in accordance with various embodiments.

FIG. 3A depicts a tool providing a first set of configuration data that is in a symbolic form to a reconfigurable circuit with a configuration data loader in accordance with various embodiments. For the embodiments, the tool 302 may include a software tool suite running on one or more computing devices such as one or more workstations. The reconfigurable circuit 304 with the configuration data loader 306 may be any type of reconfigurable circuit including a field programmable gate array (FPGA) circuit. The tool 302 may enable a user to synthesize a circuit design and/or place and route the circuit design, and to generate a first set of configuration data to configure a reconfigurable circuit to realize the circuit design. The resulting first set of configuration data may specify the configuration of the reconfigurable circuit in symbolic form and may not be fully particularized to configure the reconfigurable resources (i.e., reconfigurable function blocks 308 and/or reconfigurable connection matrices 310) of the reconfigurable circuit 304. The first set of configuration data to be provided to the reconfigurable circuit 304 may be provided in the form of a bit stream as shown.

The reconfigurable circuit 304 may include the configuration data loader 306, a plurality of reconfigurable resources including reconfigurable function blocks 308 and reconfigurable connection matrices 310, coupled together as shown. Each of the reconfigurable function blocks 308 may further include reconfigurable logic while each of the reconfigurable connection matrices 310 may further include a plurality of inputs and outputs that are coupled to the reconfigurable function blocks 308. Further, each of the reconfigurable connection matrices 310 may also include connection resources that can be configured to selectively couple inputs to specific outputs and/or vice versa. For purposes of this description, the reconfigurable logic and the connection resources included in the reconfigurable resources (i.e., reconfigurable function blocks 308 and reconfigurable connection matrices 310) may be referred to as local or physical resources.

In various embodiments, the configuration data loader 306 may be adapted to receive the first set of configuration data to configure all or a subset of the reconfigurable logic and the connection resources included in the reconfigurable circuit 304. For the embodiments, the first set of configuration data to be received may include configuration data for bitmaps for the reconfigurable function blocks 308 and/or the reconfigurable connection matrices 310.

Figure 3B:
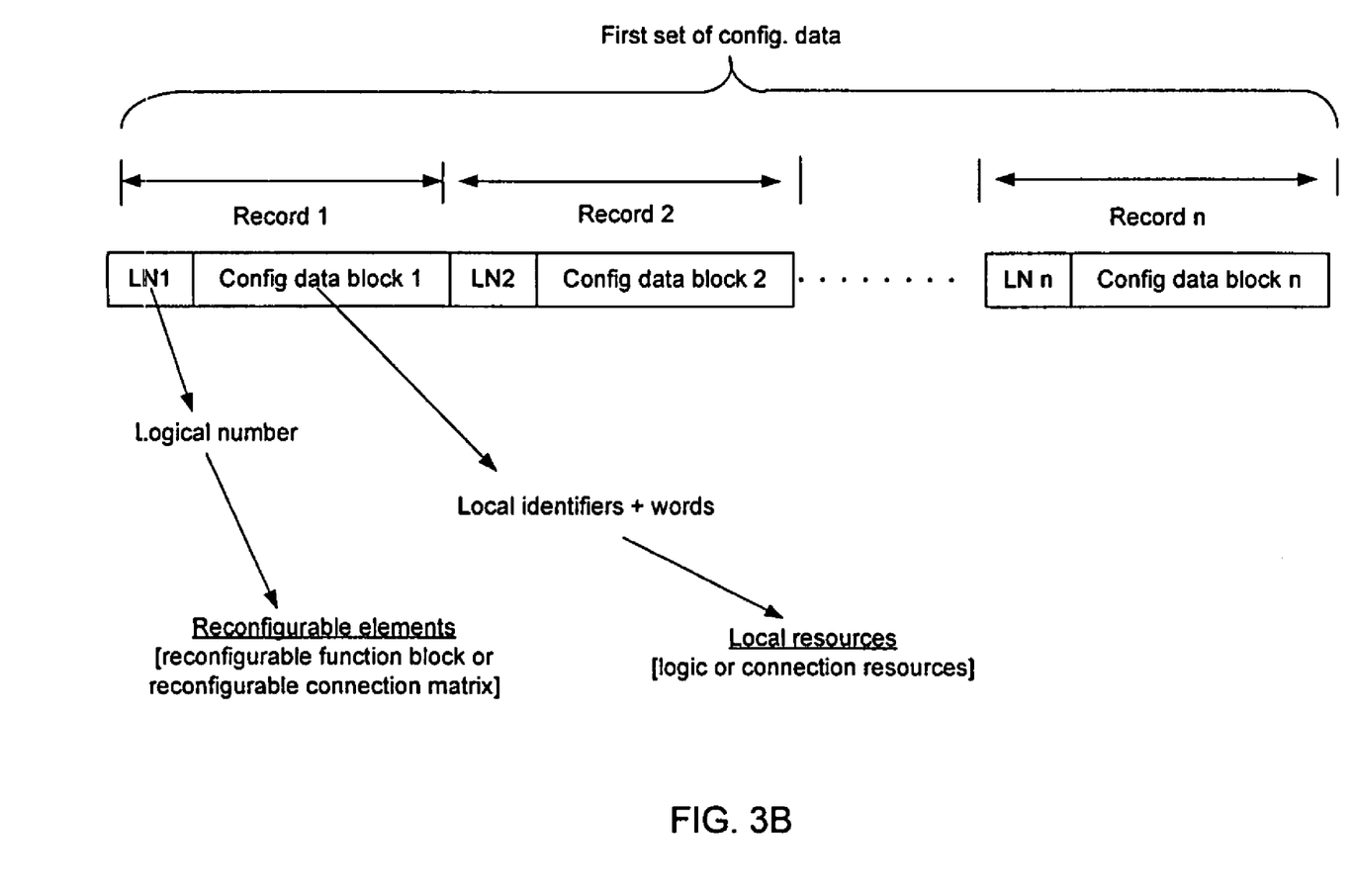
FIG. 3B illustrates a first set of configuration data to be received by a reconfigurable circuit with a configuration data loader in accordance with various embodiments.

In some embodiments, the first set of configuration data may be structured to include records of configuration data blocks as depicted in FIG. 3B. For these embodiments, each of the records may include a logical number identifying a reconfigurable function block 308 or a reconfigurable connection matrix 310 to be configured using at least in part the configuration data in the configuration data block of the record. Each configuration data block of a record may further contain logical identifiers that identify local resources (e.g., reconfigurable logic or connection resources) of the reconfigurable function block or connection matrix identified by the logical number included in the record. In some embodiments, the logical identifiers may facilitate mapping to the actual local or physical resources of the reconfigurable function block or connection matrix. Each of the configuration data blocks may further include configuration data such as words or configuration data for generating words that may be used at least in part to configure the local resources identified by the local identifiers contained in the configuration data block. As previously alluded to, the configuration data included in at least some of the configuration data blocks of the records may include configuration data to facilitate the generation of a bitmap for the identified reconfigurable function block or connection matrix.

Returning to FIG. 3A, the configuration data loader 306 upon receiving the first set of configuration data may generate and output to the reconfigurable resources (i.e., reconfigurable function blocks 308 and reconfigurable connection matrices 310), a second set of configuration data based at least on the first set of configuration data, with the second set of configuration data being particularized in specifying the configuration of the reconfigurable function blocks 308 and/or reconfigurable connection matrices 310. In some embodiments, the generating and outputting of the second set of configuration data may be as a result of formatting the first set of configuration data. As a result of the formatting of the first set of configuration data, the second set of configuration data that is generated may be particularized to configure local resources (i.e., reconfigurable logic or connection resources) of the reconfigurable resources. The formatting process is further described below.

In various embodiments, at least one of the reconfigurable function blocks 308 may be designed to be configured by corresponding configuration bitmaps. For these embodiments, the configuration data loader 306 may be further designed to receive a first set of configuration data having configuration data for such configuration bitmaps. Correspondingly, the configuration data loader 306 may generate and output to the reconfigurable function blocks 308, the configuration data of the configuration bitmaps as part of the second set of configuration data.

In various embodiments, at least one of the reconfigurable connection matrices 310 may be adapted to be configured by a bitmap organized in words, each word being associated with an output of the reconfigurable connection matrix and containing one bit for each input of the reconfigurable connection matrix that indicates whether or not the input is connected to the output. For these embodiments, the configuration data loader 306 may be designed to format a first set of configuration data by receiving the first set of configuration data that includes a logical identifier of an input to be coupled to an output of the reconfigurable connection matrix adapted to be configured by a bitmap. The configuration data loader 306 may then generate a bitmap based at least in part on the logical number, the bitmap containing at least a bit set at logic one, wherein the bitmap includes a bit for each of the inputs in the reconfigurable connection matrix, and the bit that is set at logic one is associated with the input identified by the logical identifier.

In alternative embodiments or the same embodiments, at least one of the reconfigurable connection matrices may be adapted to be configured by a bitmap organized in words, each word being associated with an input instead of an output (as described above) of a reconfigurable connection matrix and containing one bit for each output included in the reconfigurable connection matrix. Each bit may be associated with an output and may indicate whether or not the input that is associated with the word is to be coupled to the output associated with the bit. For these embodiments, the first set of configuration data to be received by the configuration data loader 306 may include records that include logical identifiers of inputs of a reconfigurable connection matrix adapted to be configured by a bitmap. The logical identifiers identifying inputs to be or not to be coupled to outputs of the reconfigurable connection matrix. For the embodiments, the configuration data loader 306 may be further designed to format the first set of configuration data by storing the logical identifiers included in the records of the first set of configuration data into a storage such as an intermediate storage (that may be part of the configuration data loader 306), and to generate words of a bitmap to be used to configure the reconfigurable connection matrix adapted to be configured by a bitmap, such generation being based on the logical numbers stored in the intermediate storage, wherein each bit of each of the words are generated as a result of comparison of the logical identifiers stored in the intermediate storage with a logical identifier of an input to which the generated word is associated with.

Figure 4:
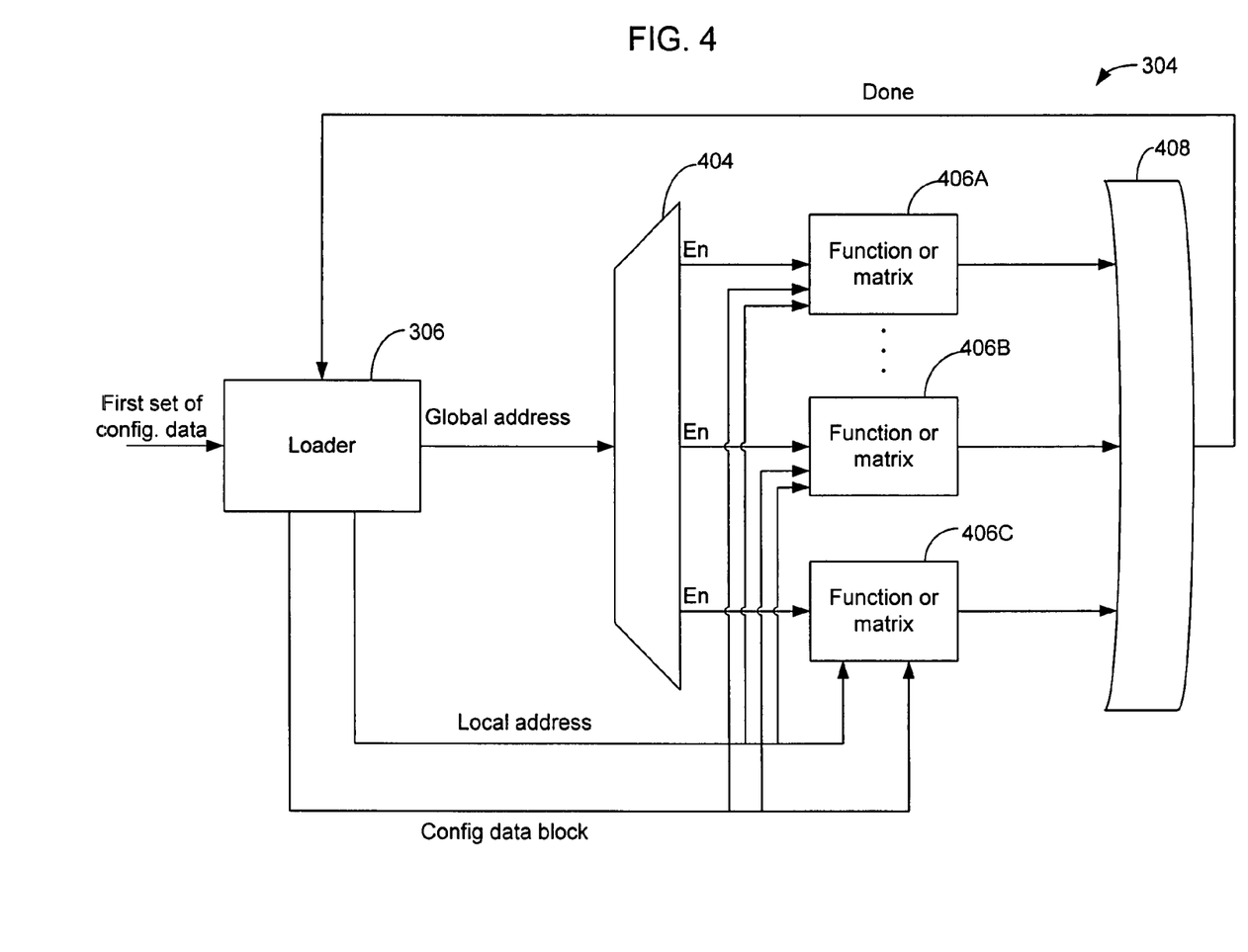
FIG. 4 illustrates a block diagram of the configuration data loader of the reconfigurable circuit of FIG. 3A providing a configuration data block to a reconfigurable resource in accordance with various embodiments.

FIG. 4 depicts the configuration data loader of the reconfigurable circuit of FIG. 3A providing a configuration data block to a reconfigurable resource (i.e., reconfigurable function block or reconfigurable connection matrix) in accordance with various embodiments. For the embodiments, the reconfigurable circuit 304 includes a configuration data loader 306, a decoder 404, a plurality of reconfigurable resources (i.e., reconfigurable function blocks and/or reconfigurable connection matrices) 406A to 406C, and an OR gate 408. Note that although only three reconfigurable resources 406A to 406C are shown, in alternative embodiments, there may be more or fewer than three reconfigurable resources 406A to 406C. Note further that in alternative embodiments, the reconfigurable circuit 304 may include more than a single configuration data loader 306 and/or single decoder 404. Further still, additional components may be further included in the reconfigurable circuit 304 in various alternative embodiments.

In various embodiments, and as previously described, the configuration data loader 306 may receive from one or more external sources a first set of configuration data, the first set of configuration data being in a symbolic form and that may not be particularized for configuring the plurality of reconfigurable resources 406A to 406C. Also, as previously described, the first set of configuration data to be received by the configuration data loader 306 may include records.

For ease of understanding, the following example is provided describing how the configuration data loader 306 may process a single record. The configuration data loader 306, upon receiving a stream of records may map the logical number included in each record to a physical global address to physically identify the reconfigurable resource 406A to 406C to be configured, based at least on the logical number. The global address is then relayed to the decoder 404, which may convert a binary representation of the global address into a "one hot" representation of the global address. For example, the binary representation of the number 5 may be represented by "101," but by converting that representation into a "one hot" representation, the resulting representation would only have the fifth bit being set at one. Thus the decoder 404 (or in alternative embodiments, a plurality of decoders) may facilitate provisioning of the global address generated from the configuration data loader 306. As a result, only one of the reconfigurable resources 406A to 406C that has a corresponding address may be enabled to be configured. In this illustration, reconfigurable resource 406C is enabled.

In addition to mapping the logical number to a global address, the configuration data loader 306 may format the configuration data block of each record. The formatting may result in, for example, configuration data that is in a form or format usable for locally configuring the local resources of the enabled reconfigurable resource 406C. This may include, for example, in the case where the reconfigurable resource to be configured is a reconfigurable interconnect matrix, the generation of words for a bitmap to be used to configure the reconfigurable interconnect matrix as previously described.

The formatting performed by the configuration data loader 306 may further involve generating and outputting local addresses of the enabled reconfigurable resource 406C to supplement the global address generated by the configuration data loader 306 to particularly identify the logic and/or connection resources (i.e., local resources) within the addressed reconfigurable resource 406C to be configured. Returning to the above example, when the configuration data block of a record is formatted by the configuration data loader 306, a plurality of local address may be generated and directed to the reconfigurable resource 406C that has been enabled by the global address. The local addresses along with the configuration data block sent by the configuration data loader 306 to the enabled reconfigurable resource 406C may then be used to configure selected local resources (i.e., configurable logic and/or connection resources) included in the reconfigurable resource 406C based at least on the local addresses. Note that in various embodiments the configuration data block sent to the reconfigurable resource 406C may be comprised of a plurality of words, each word associated with a corresponding local address generated by the configuration data loader 306.

Once the configuration of the enabled reconfigurable resource 406C has been completed, a done signal may be transmitted back to the configuration data loader 306 to reset the configuration data loader 306 so that it may provide properly formatted configuration data to the next reconfigurable resource (e.g., 406A or 406B) to be configured. For example, as a result of the done signal, the local addresses to be generated by the configuration data loader 306 may be reset to some base number such as zero when the next reconfigurable resource is to be configured. This process of generating local addresses and passing along a configuration data block to a reconfigurable resource 406A to 406C may be repeated again and again for all or a subset of the reconfigurable resources 406A to 406C present in the reconfigurable circuit.

Figure 5:
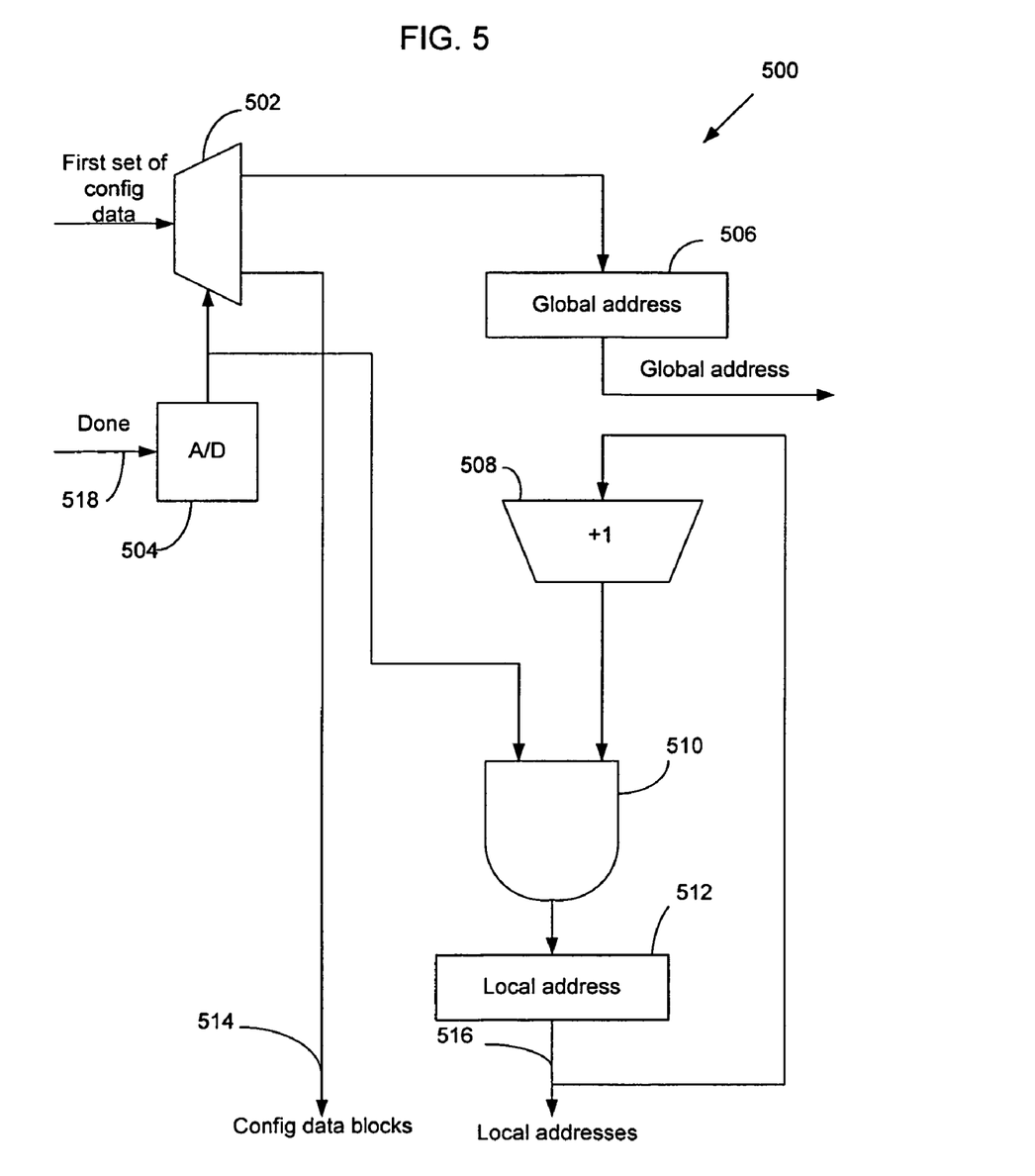
FIG. 5 illustrates a configuration data loader in accordance with various embodiments.

FIG. 5 depicts a configuration data loader in accordance with various embodiments. For the embodiments, the configuration data loader 500 may be part of a reconfigurable circuit such as those depicted in FIGS. 3A and 4 and may include a demultiplexor 502, address/data (A/D) state 504, global address storage 506, an adder 508, an AND gate 510, and a local address storage 512, coupled together as shown. In various embodiments, the demultiplexor 502 may initially receive a first set of configuration data. Based on the first set of configuration data, the configuration data loader 500 may generate a second set of configuration data that may include, in addition to configuration data, global addresses of all or a subset of the reconfigurable resources present in the reconfigurable circuit. The configuration data loader 500, in some embodiments, may further format the first set of configuration data that may result in the generation of local addresses as previously described.

Again, for ease of understanding, another example is provided herein describing how the configuration data loader 306 processes a single record (of the first set of configuration data) in order to generate particularized configuration data (i.e., second set of configuration data) for a particular reconfigurable resource (i.e., reconfigurable function block or reconfigurable connection matrix) in accordance with some embodiments. Initially, the configuration data loader 306 receives the record through the demultiplexor 502. The record may include a logical number that identifies a reconfigurable resource (i.e., targeted reconfigurable resource) to be configured using the configuration data block associated with the record. A global address may be calculated at least based on this logical number and stored in the global address storage 506. The Address/Data state 504 can then be flipped to Data to further process the incoming record. The configuration data block may further include logical identifiers that facilitate identification of the specific local resources of the targeted reconfigurable resource that are to be configured using the configuration data block.

Once the demultiplexor 502 receives the record, the global address storage 506 generates a global address of the targeted reconfigurable resource to be configured. The global address generated by the global address storage 506 may be based at least in part on the logical number included in the record. Although the global address that is generated will be provided to all of the reconfigurable resources in the reconfigurable circuit (see FIG. 4), the global address may only enable a particular reconfigurable resource that is the intended recipient of the configuration data block to be outputted by the configuration data loader 500 as indicated by 514. Note that in some embodiments, the global address storage 506 may be reset at the beginning of each record received by the configuration data loader 500 or at the end of each configuration data block.

The demultiplexor 502 may further forward the configuration data of the record to the targeted reconfigurable resource that has been enabled by the global address. In various embodiments, the configuration data forwarded to the enabled reconfigurable resource may include a plurality of words to be used to configure specific local resources of the enabled reconfigurable resource. While the configuration data block is being forwarded to the targeted reconfigurable resource, the configuration data loader 500 may generate and output local addresses of specific local resources (e.g., in the case of reconfigurable connection matrix, inputs, outputs and/or connection resources) of the targeted reconfigurable resource. These local addresses may enable the specific local resources to receive the proper configuration data included in the configuration data block. In other words, as the configuration data loader 500 sends the configuration data block (containing configuration data for configuring the specific local resources of the targeted reconfigurable resource) to the targeted reconfigurable resource, the configuration data loader 500 may generate a series of local addresses as indicated by 516. The local addresses generated will enable the specific local resources in the targeted reconfigurable resource to receive the appropriate configuration data.

An adder 508 may be used to increment the local addresses to be generated by the local address storage 512. For example, and as previously described, the configuration data block that is to be provided by the configuration data loader 500 (as depicted by ref. 514) may include a plurality of words, each word for configuring a particular local resource (e.g., connection resource). Each word that is generated by the configuration data loader 500 may be associated with a local address that is generated by the local address storage 512. The local addresses that are generated may be incremented each time, for example, a word is generated, and thus assuring that each word of a configuration data block will be associated with a different local address. Upon reaching the end of a configuration data block, the local address storage 512 may be reset to, for example, zero, and the process of incrementing the local addresses to be generated may be repeated for the next configuration data block to be generated by the configuration data loader 500. Note that for purposes of this description, the word "generated" should be broadly interpreted and may mean actual generation or simply passing along information or data received from another source.

Again, as previously alluded to, once the targeted reconfigurable resource has been provided with configuration data for all or a subset of its local or physical resources included in the targeted reconfigurable resource, a done signal may be generated (see FIG. 4) by the targeted reconfigurable resource, which may then be received by the configuration data loader 500 as indicated by 518. The done signal, in various embodiments, may cause the local address storage 512 to reset to zero. The done signal may also facilitate the resetting of the global address storage 506 and the Address/Data state 504 to the Address state for subsequent records it may receive. This process of providing global and local addresses, and the providing of a configuration data block to a reconfigurable resource may be repeated again and again for all or a subset of the reconfigurable resources in the reconfigurable circuit.

In some embodiments where the targeted reconfigurable resource is a reconfigurable function block, the configuration data provided by the configuration data loader 500 may be stored in a configuration memory. If, on the other hand, the targeted reconfigurable resource is a reconfigurable connection matrix, then the configuration data provided by the configuration data loader 500 may be decoded so that for each output of the reconfigurable connection matrix, the identification of an input that may be coupled to the output may be transformed into a bitmap that are provided for each input/output pair whether they are coupled or not.

Figure 6A:
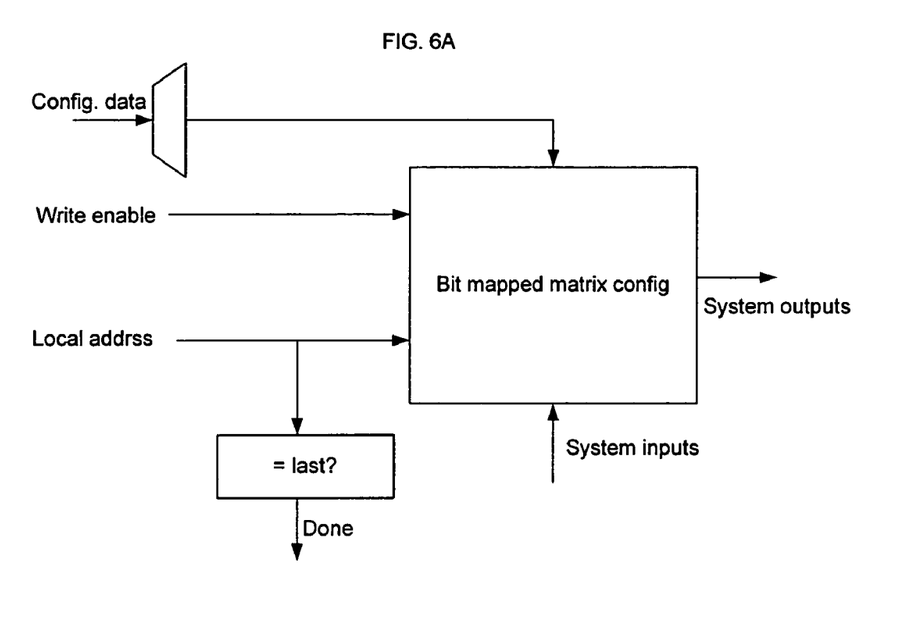
FIG. 6A illustrates a reconfigurable connection matrix in accordance with various embodiments.
Figure 6B:
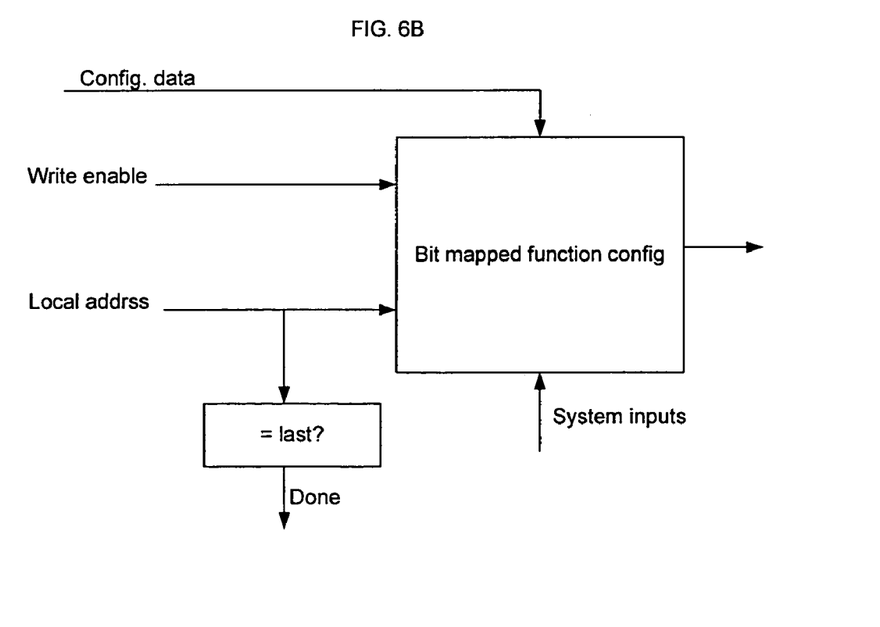
FIG. 6B illustrates a reconfigurable function block in accordance with various embodiments.

FIGS. 6A and 6B depict a reconfigurable connection matrix and a reconfigurable function block, respectively, in accordance with various embodiments. As shown, both have similar features including, for example, input ports for configuration data, write enable, and local address.

Figure 7:
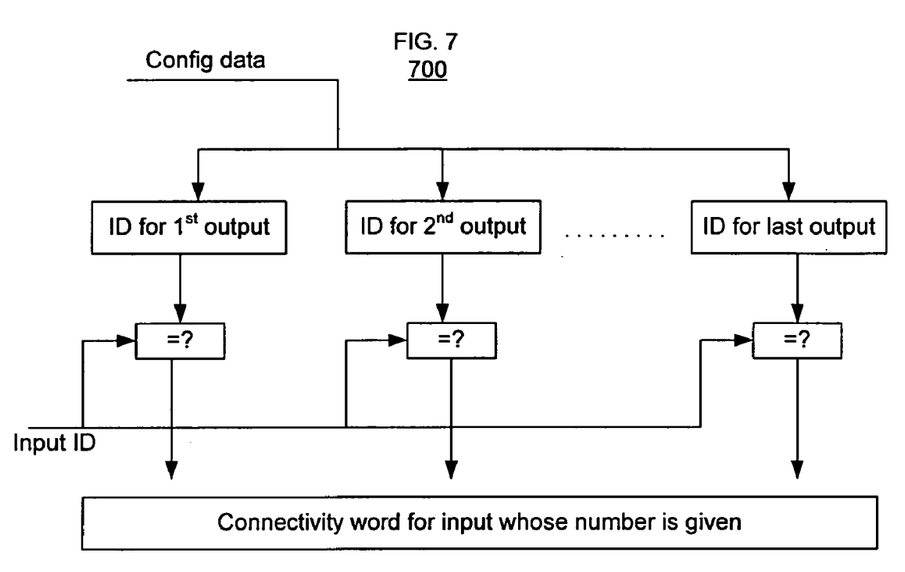
FIG. 7 illustrates a system for processing and formatting a first set of configuration data in accordance with various embodiments.

FIG. 7 depicts a system for processing and formatting a first set of configuration data in accordance with alternative embodiments. The system 700 may be included in a configuration data loader of a reconfigurable circuit such as those depicted in FIGS. 3A and 4 and may be employed when the reconfigurable connection matrices of the reconfigurable circuit are adapted to be configured by bitmaps organized in words, wherein each word being associated with an input (instead of an output as described for the previous embodiments) of a reconfigurable connection matrix and containing one bit for each output included in the reconfigurable connection matrix, and wherein each bit indicates whether or not the input is to be coupled to the output associated with the bit.

For the embodiments, the first set of configuration data that may be received by the reconfigurable circuit with the system 700 may include at least logical identifiers of inputs of a reconfigurable connection matrix to be or not to be coupled to an output of the reconfigurable connection matrix. The system 700 may facilitate the formatting of the first set of configuration data by storing the logical identifiers into a storage, such as an intermediate storage, and to generate a word of a bitmap to be used to at least in part configure the reconfigurable connection matrix, the generating based on the logical identifiers stored in the intermediate storage, wherein each bit of the word is generated as a result of comparison of a logical identifier stored in the intermediate storage with a logical identifier of an input to which the generated word is associated with.

Although specific embodiments have been illustrated and described herein, it will be appreciated by those of ordinary skill in the art and others, that a wide variety of alternate and/or equivalent implementations may be substituted for the specific embodiments shown and described without departing from the scope of the present invention. This application is intended to cover any adaptations or variations of the embodiments discussed herein. Therefore, it is manifested and intended that the invention be limited only by the claims and the equivalents thereof.

What is claimed is:

1. A reconfigurable circuit, comprising:
   reconfigurable function blocks, each of the reconfigurable function blocks including reconfigurable logic;
   reconfigurable connection matrices, each of the reconfigurable connection matrices including inputs coupled to the reconfigurable function blocks, outputs coupled to the reconfigurable function blocks, and connection resources that can be reconfigured to selectively connect the inputs of the reconfigurable connection matrix to the outputs of the reconfigurable connection matrix; and
   a configuration data loader coupled to the reconfigurable function blocks and the reconfigurable connection matrices, and adapted to receive a first set of configuration data to configure all or a subset of the reconfigurable logic and the connection resources, with the first set of configuration data being in a symbolic form and not fully particularized in specifying said configuring, and to generate and output a second set of configuration data based at least on the first set of configuration data, with the second set of configuration data being fully particularized in specifying said configuring.

2. The reconfigurable circuit of claim 1, wherein the reconfigurable connection matrices are designed to be configured by corresponding configuration bitmaps, and the configuration data loader is further designed to generate and output said second set of configuration data including configuration data of said configuration bitmaps.

3. The reconfigurable circuit of claim 1, wherein said configuration data loader is designed to configure all or a subset of the said reconfigurable function blocks and/or reconfigurable connection matrices at power-up of the reconfigurable circuit or upon instructed.

4. The reconfigurable circuit of claim 1, wherein said reconfigurable circuit is a field programmable gate array (FPGA) circuit.

5. The reconfigurable circuit of claim 1, wherein said configuration data loader is designed to
   receive the first set of configuration data with the first set of configuration data having records comprising logical numbers that logically identify a number of reconfigurable function blocks and/or a number of reconfigurable connection matrices to be configured, and the records further having configuration data blocks, for configuring the reconfigurable function blocks or the reconfigurable connection matrices identified by the corresponding logical numbers included in the records, map the logical numbers included in the records to physical global addresses to physically identify the reconfigurable function blocks and/or reconfigurable connection matrices to be configured, based at least in part on the logical numbers;

format the first set of configuration data, if needed, into a form usable for locally configuring the reconfigurable function blocks and/or the reconfigurable connection matrices; and generate and output the second set of configuration data including the global addresses.

6. The reconfigurable circuit of claim 5 further comprising one or more decoders coupling the configuration data loader to the reconfigurable function blocks and the reconfigurable connection matrices to facilitate provision of said global addresses from said configuration data loader to the reconfigurable function blocks and the reconfigurable connection matrices.

7. The reconfigurable circuit of claim 5, wherein the reconfigurable function blocks are designed to be configured by corresponding configuration bitmaps, and the configuration data loader is further designed to receive said first set of configuration data having configuration data of said configuration bitmaps, and generate and output said configuration data of said configuration bitmaps as part of said second set of configuration.

8. The reconfigurable circuit of claim 5, wherein said configuration data loader is further designed to said format by generating and outputting local addresses to supplement the global addresses to particularly identify the logic within the addressed reconfigurable function blocks, and/or connection resources within the addressed reconfigurable connection matrices.

9. The reconfigurable circuit of claim 8, wherein the configuration data loader comprises an adder adapted to facilitate said generating and outputting of the local addresses, to reset at the beginning of each of the records, and to increment each time a word is generated by the configuration data loader as a result of said formatting of the first set of configuration data.

10. The reconfigurable circuit of claim 8, wherein at least one of said reconfigurable connection matrices is adapted to be configured by a bitmap organized in words, each word being associated with an output of the reconfigurable connection matrix and containing one bit for each input of the reconfigurable connection matrix that indicates whether or not said input is coupled to said output; and the configuration data loader is designed to said format by receiving the first set of configuration data including at least a logical identifier of an input of the reconfigurable connection matrix to be coupled to an output of the reconfigurable connection matrix, and generate a bitmap based at least in part on the logical identifier, the bitmap containing a bit set at logic one, wherein the bitmap includes a bit for each of the inputs in the reconfigurable connection matrix, and the bit set at logic one is associated with the input identified by the logical identifier.

11. The reconfigurable circuit of claim 8, wherein at least one of said reconfigurable connection matrices is adapted to be configured by a bitmap organized in words, each word being associated with an input of the reconfigurable connection matrix and containing one bit for each output included in the reconfigurable connection matrix, each bit indicates whether or not said input is to be coupled to the output associated with the bit;

wherein said records include at least one record that is associated with a reconfigurable connection matrix, said at least one record containing one or more logical identifiers of inputs of the reconfigurable connection matrix to be or not to be coupled to an output of the reconfigurable connection matrix; and the configuration data loader is further designed to said format by storing the one or more logical identifiers included in the at least one record into a storage, and to generate a word of a bitmap to be used to at least in part configure the reconfigurable connection matrix, the generating based on the one or more logical identifiers stored in the intermediate storage, wherein each bit of the word is generated as a result of comparison of a logical number stored in the intermediate storage with a logical identifier of an input to which the generated word is associated with.

12. A method, comprising:

providing a tool to enable a user to synthesize a circuit design and/or place and route the circuit design on one or more computing devices, including generation of a first set of configuration data to configure a reconfigurable circuit to realize the circuit design, with the first set of configuration data specifying the configuring of the reconfigurable circuit in symbolic form, and not fully particularized to configure reconfigurable resources of the reconfigurable circuit; and providing the reconfigurable circuit, the reconfigurable circuit having reconfigurable function blocks, reconfigurable connection matrices, and a configuration loader designed to receive said first set of configuration data specifying said configuration in symbolic form, and generate and output a second set of configuration data to configure all or a subset of the reconfigurable function blocks and/or reconfigurable connection matrices to realize the circuit design.

13. The method of claim 12, wherein said providing of a tool comprises providing a tool designed to generate the first set of configuration data with configuration data identifying outputs of the reconfigurable connection matrices to be used and inputs of the reconfigurable connection matrices to be coupled to the identified outputs.

14. The method of claim 13, wherein said providing of the reconfigurable circuit comprises providing a reconfigurable circuit with the configuration data loader designed to generate and output the second set of configuration data, with the second set of configuration data having configuration data to configure all or a subset of the reconfigurable connection matrices, based at least in part on the specified outputs to be used and the inputs to be coupled to the outputs.

15. The method of claim 12, wherein said providing of a tool comprises providing a tool designed to generate the first set of configuration data with records comprising logical numbers that logically identify the reconfigurable function blocks and/or reconfigurable connection matrices to be configured, and the records each being a configuration data block, further having configuration data for correspondingly configuring the reconfigurable function blocks and/or the reconfigurable connection matrices identified by the logical numbers included in the records.

16. The method of claim 15, wherein said providing of the reconfigurable circuit comprises providing a reconfigurable circuit with the configuration data loader designed to:

map the logical numbers included in the records to physical global addresses to physically identify the reconfigurable function blocks and/or reconfigurable connection matrices to be configured, based at least in part on the logical numbers;

format the first set of configuration data, if needed, into a form usable for locally configuring the reconfigurable function blocks and/or the reconfigurable connection matrices; and generate and output the second set of configuration data, with the second set of configuration data having the global addresses.

17. The method of claim 16, wherein said providing of the reconfigurable circuit comprises providing a reconfigurable circuit with the configuration data loader further designed to said format by generating and outputting the second set of configuration data, with the second set of configuration data having local addresses to supplement the global addresses to particularly identify logic within the addressed reconfigurable function blocks and/or connection resources within the addressed reconfigurable connection matrices.

* * * * *